United States Patent
Park (10) Patent No.: US 7,754,596 B2
(45) Date of Patent: Jul. 13, 2010

(54) SEMICONDUCTOR DEVICE PREVENTING ELECTRICAL SHORT AND METHOD OF MANUFACTURING THE SAME

(75) Inventor: Byung-jun Park, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 12/401,145

(22) Filed: Mar. 10, 2009

(65) Prior Publication Data
US 2009/0176361 A1    Jul. 9, 2009

Related U.S. Application Data

(62) Division of application No. 11/345,901, filed on Feb. 2, 2006, now Pat. No. 7,521,804.

(30) Foreign Application Priority Data
Feb. 3, 2005    (KR) .................. 10-2005-0010227

(51) Int. Cl.
*H01L 21/44* (2006.01)
(52) U.S. Cl. .................. 438/597; 438/396; 438/399; 438/640; 438/666; 438/688; 257/E21.477
(58) Field of Classification Search .................. 438/396, 438/399, 597; 257/E21.477
See application file for complete search history.

(56) References Cited

U.S. PATENT DOCUMENTS

| | | | |
|---|---|---|---|
| 5,506,166 A * | 4/1996 | Sandhu et al. .............. 438/396 |
| 5,933,756 A | 8/1999 | Fuse | |
| 6,033,962 A * | 3/2000 | Jeng et al. ................... 438/301 |
| 6,093,615 A | 7/2000 | Schuele et al. | |
| 6,410,948 B1 | 6/2002 | Tran et al. | |
| 6,586,301 B2 * | 7/2003 | Orita .......................... 438/257 |
| 6,589,837 B1 | 7/2003 | Ban et al. | |
| 7,157,369 B2 | 1/2007 | Sugimura | |
| 7,183,603 B2 * | 2/2007 | Park .......................... 257/298 |
| 7,230,291 B2 | 6/2007 | Kim | |
| 2003/0156380 A1 | 8/2003 | Fazan et al. | |
| 2005/0019960 A1 * | 1/2005 | Lee et al. ...................... 438/3 |
| 2006/0001161 A1 * | 1/2006 | Graettinger et al. ......... 257/751 |
| 2008/0157155 A1 * | 7/2008 | Wang .......................... 257/295 |

FOREIGN PATENT DOCUMENTS

| | | |
|---|---|---|
| JP | 09097902 | 4/1997 |
| JP | 02001057411 | 2/2001 |
| KR | 1020000009277 | 2/2000 |
| KR | 1020000020581 | 4/2000 |

(Continued)

*Primary Examiner*—Charles D Garber
*Assistant Examiner*—Angel Roman
(74) *Attorney, Agent, or Firm*—Mills & Onello, LLP (57) ABSTRACT

A semiconductor device capable of preventing an electrical short between contacts and their adjacent contact pads and a method of manufacturing the same are provided. A first interlayer insulating layer is formed on the semiconductor substrate including the active region. Contact pads pass through the first interlayer insulating layer and contact with the active region. Contacts are formed on the contact pads and are connected to a conductive layer disposed above the contacts. The contact pads have a height lower than a top surface of the first interlayer insulating layer such that the contact pads have smaller thickness than the first interlayer insulating layer.

8 Claims, 6 Drawing Sheets

FOREIGN PATENT DOCUMENTS

| | | |
|---|---|---|
| KR | 1020000054995 | 9/2000 |
| KR | 1020000060603 | 10/2000 |
| KR | 1020010005110 | 1/2001 |
| KR | 1020050004896 | 1/2005 |
| WO | 9840909 | 9/1998 |

* cited by examiner

FIG. 6B

SEMICONDUCTOR DEVICE PREVENTING ELECTRICAL SHORT AND METHOD OF MANUFACTURING THE SAME

RELATED APPLICATIONS

This application is a divisional application of U.S. patent application Ser. No. 11/345,901, filed on Feb. 2, 2006, which claims the benefit of Korean patent application number 10-2005-0010227, filed on Feb. 3, 2005, in the Korean Intellectual Property Office, the contents of which applications are incorporated herein in their entirety by reference.

BACKGROUND OF THE INVENTION

1. Field of the Invention

The present invention relates to a semiconductor device and a method of manufacturing the same, and more particularly, to a semiconductor device capable of preventing an electrical short between a contact and its adjacent contact pad, the contact being electrically connected to an upper conductive layer, and a method of manufacturing the same.

2. Description of the Related Art

With the development of technology for manufacturing semiconductor devices, semiconductor devices are more highly integrated. Accordingly, the size of contacts electrically connecting layers and the distances between the contacts have been reduced. Also, the distances between contact pads have been reduced. The contacts can be a bottom electrode contact of a capacitor and/or a bit line contact.

Figure 1A:
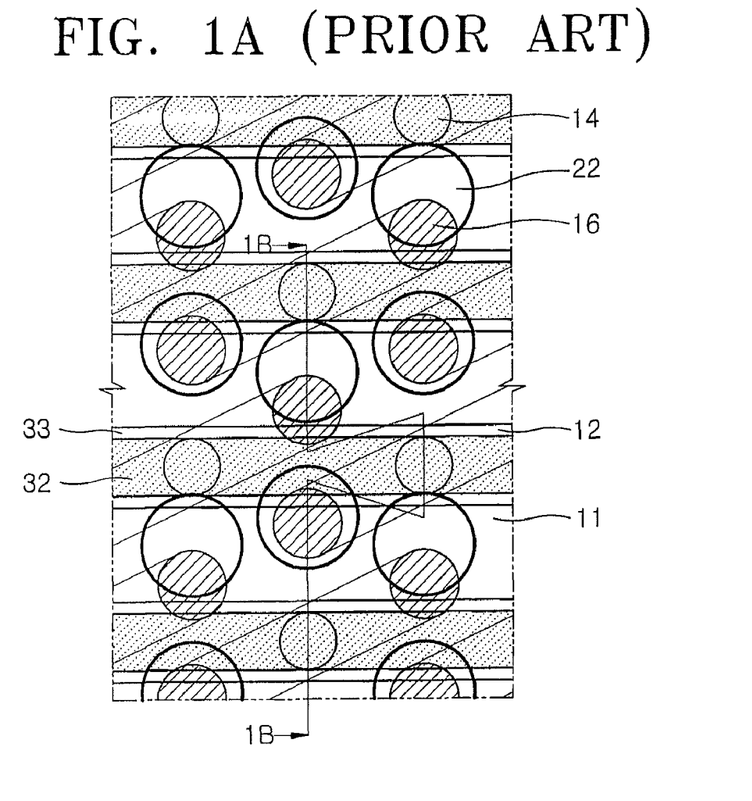
FIG. 1A is a plan view of a conventional bottom electrode contact contacting with a contact pad.
Figure 1B:
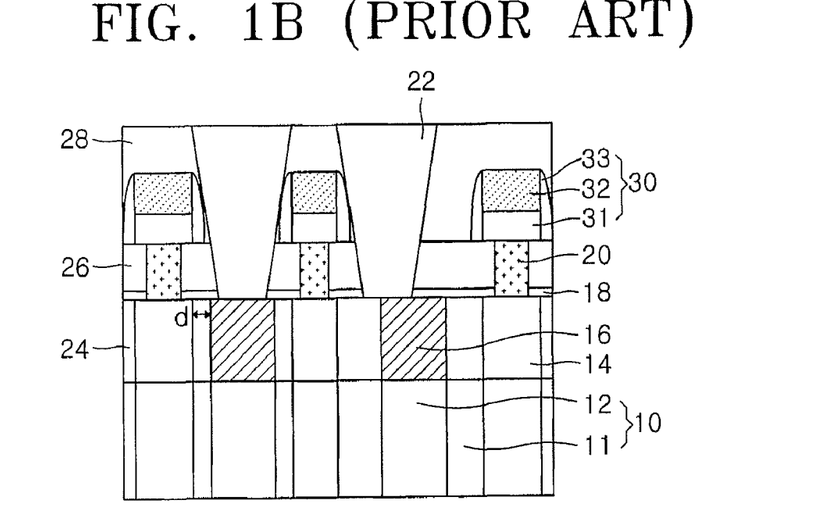
FIG. 1B is a sectional view taken along line 1B-1B of FIG. 1A.

FIG. 1A is a plan view of a conventional bottom electrode contact 22 contacting with a contact pad. FIG. 1B is a sectional view taken along line 1B-1B of FIG. 1A. For convenience, elements not essential to this description are not shown in FIG. 1.

Referring to FIGS. 1A and 1B, a semiconductor substrate 10 has an active region 12 defined by a device isolation layer 11. Contact pads contacting with the active region 12 pass through a first interlayer insulating layer 24 formed on the semiconductor substrate 10. The contact pads include a bottom electrode contact pad 16 and a bit line contact pad 14. The bottom electrode contact pad 16 is connected with a capacitor bottom electrode contact 22 disposed above the bottom electrode contact pad 16, and the bit line contact pad 14 is connected with a bit line contact 20 disposed above the bit line contact pad 14.

The bit line contact 20 passes through a second interlayer insulating layer 26 formed on the first interlayer insulating layer 24 and the contact pads 14 and 16. The bottom electrode contact 22 passes through a third interlayer insulating layer 28 and the second interlayer insulting layer 26. The third interlayer insulating layer 28 is formed on the bit line contact 20 and the second interlayer insulting layer 26. A bit line structure 30 includes a bit line 31, an insulating layer 32, and a spacer 33 within the third interlayer insulating layer 28. An etching stopping layer 18 can be further formed at the bottom of the second interlayer insulating layer 26 except for a portion where the contact pads 14 and 16 are connected with the contacts 20 and 22.

The contact pads 14 and 16 formed inside the first interlayer insulating layer 24 have thickness equal to that of the first interlayer insulating layer 24. However, as the design rule is scaled down, the distance d between the bottom electrode contact 22 and its adjacent bit line contact pad 14 becomes shorter. If the distance d becomes shorter, the contacts 20 and 22 and their adjacent contact pads 14 and 16 may be electrically shorted.

SUMMARY OF THE INVENTION

The present invention provides a semiconductor device capable of preventing an electrical short between contacts and their adjacent contact pads.

The present invention also provides a method of manufacturing a semiconductor device capable of preventing an electrical short between contacts pads and their adjacent contact pads.

According to an aspect of the present invention, there is provided a semiconductor device preventing an electrical short, including: a semiconductor substrate; an active region formed in the semiconductor substrate and defined by a device isolation layer; a first interlayer insulating layer formed on the semiconductor substrate including the active region; contact pads passing through the first interlayer insulating layer and contacting with the active region; and contacts formed on the contact pads, the contacts being connected to a conductive layer disposed above the contacts, wherein the contact pads have a height lower than a top surface of the first interlayer insulating layer such that the contact pads have smaller thickness than the first interlayer insulating layer.

The contact pads may include: a bottom electrode contact pad connecting with a capacitor bottom electrode contact disposed above the bottom electrode contact pad; and a bit line contact pad connecting with a bit line contact disposed above the bit line contact pad. The semiconductor device may further include an etching stopping layer on the contact pads and the first interlayer insulating layer, except for a portion where the contact pads are connected with the contacts. A distance between the bottom surfaces of the contacts may be larger than a width of a protruded portion of the first interlayer insulating layer.

The contact pads may be made of doped polysilicon. An upper portion of the contact pads may be removed by adjusting an etching time according to a recessed amount thereof. A recessed amount of the contact pads may increase as a distance between the contacts is shorter.

According to another aspect of the present invention, there is provided a method of manufacturing a semiconductor device preventing an electrical short, the method including: forming a first interlayer insulating layer on a semiconductor substrate having an active region defined by a device isolation layer; forming contact pads inside the first interlayer insulating layer, the contact pad electrically connecting the active region with an upper conductive layer and having a thickness equal to that of the first interlayer insulating layer; forming recessed contact pads to have less thickness than the first interlayer insulating layer by removing a portion of the contact pads; and forming contacts on the contact pads, the contacts being connected with an upper conductive layer.

The contact pads may include: a bottom electrode contact pad connecting with a capacitor's bottom electrode contact disposed above the bottom electrode contact pad; and a bit line contact pad connecting with a bit line contact pad disposed above the bit line contact pad.

In forming the contact pads having the thickness equal to the first interlayer insulating layer, the contact pads may be formed by a self-aligned method using insulating spacers formed on both sidewalls of a gate electrode, the gate electrode being formed on the semiconductor substrate.

The forming of the contact pads having the thickness equal to that of the first interlayer insulating layer may include: forming a first photoresist pattern defining the contact pad on the first interlayer insulating layer; forming a first contact hole by removing the first interlayer insulating layer according to a shape of the photoresist pattern; filling the first contact hole with a conductive material layer; and planarizing the conductive material layer and the first interlayer insulating layer to the same level, thereby forming the contact pads separated by the first interlayer insulating layer, the contact pads being formed in a shape the same as a section of the first contact hole.

The contact pads may be made of doped polysilicon.

In the recessing of the contact pads, the contact pads may be removed using an etchant that contains $CH_3COOH$.

In the recessing of the contact pads, the contact pads may be removed using a mixed gas of $CF_4$ and $O_2$, the mixed gas being a material in which an etching selectivity of polysilicon layer:silicon oxide layer is 10-50:1.

The forming of the contacts connected to the conductive layer may include: forming an etching stopping layer to cover the recessed contact pads and the first interlayer insulating layer in a blanket manner; covering a second interlayer insulating layer on the etching stopping layer; forming a second photoresist pattern defining a bit line contact on the second interlayer insulating layer; forming a second contact hole to expose the recessed bit line contact pad by removing the second interlayer insulating layer and the etching stopping layer using the second photoresist pattern as an etching mask; filling the second contact hole with a conductive material layer; and planarizing the conductive material layer and the second interlayer insulating layer, thereby forming a bit line contact separated by the second interlayer insulating layer, the bit line contact being formed in a shape equal to a section of the second contact hole.

After forming the bit line contact, the method may further include: forming a third interlayer insulating layer on the second interlayer insulating layer where the bit line contact is formed; forming a third photoresist pattern defining a bottom electrode contact on the third interlayer insulating layer; forming a third contact hole to expose the recessed bottom electrode contact pad by removing the third interlayer insulating layer, the second interlayer insulating layer, and the etching stopping layer using the third photoresist pattern as an etching mask; filling the third contact hole with a conductive material layer; and planarizing the conductive material layer and the third interlayer insulating layer to the same level, thereby forming a bottom electrode contact separated by the third interlayer insulating layer, the bottom electrode contact being formed in a shape the same as a section of the third contact hole.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

A semiconductor device and method according to the present invention will now be described more fully hereinafter with reference to the accompanying drawings, in which exemplary embodiments of the invention are shown. It should be noted that, throughout the description, unless noted otherwise, when a layer is described as being formed on another layer or on a substrate, the layer may be formed directly on the other layer or on the substrate, or one or more layers may be interposed between the layer and the other layer or the substrate.

FIGS. 2A, 3A, 4A, 5A and 6A are plan views illustrating a method of manufacturing a semiconductor device according to an embodiment of the present invention. FIGS. 2B, 3B, 4B, 5B and 6B are sectional views of FIGS. 2A, 3A, 4A, 5A and 6A, respectively, taken along line A-A of FIG. 2A.

Figure 2A:
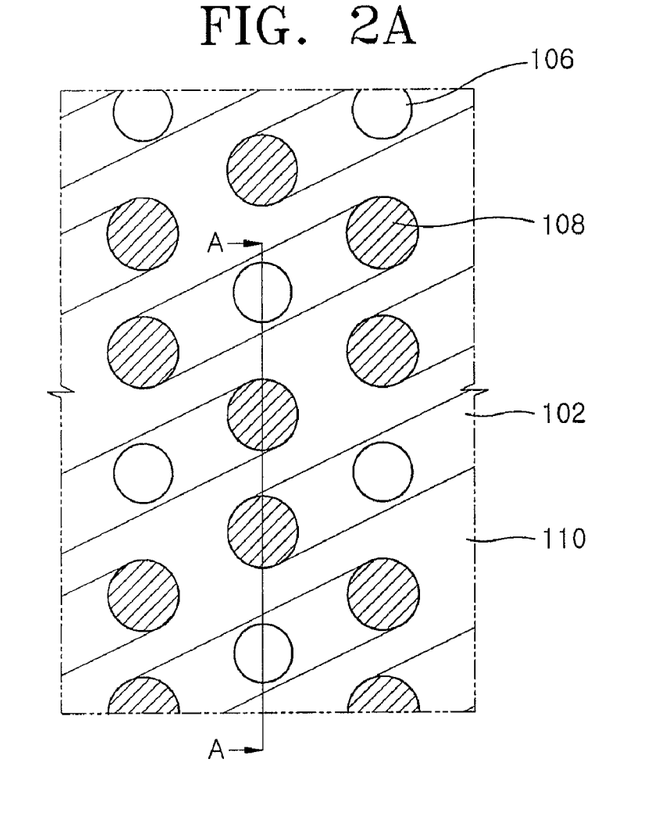
FIGS. 2A, 3A, 4A, 5A and 6A are plan views illustrating a method of manufacturing a semiconductor device according to an embodiment of the present invention.
Figure 2B:
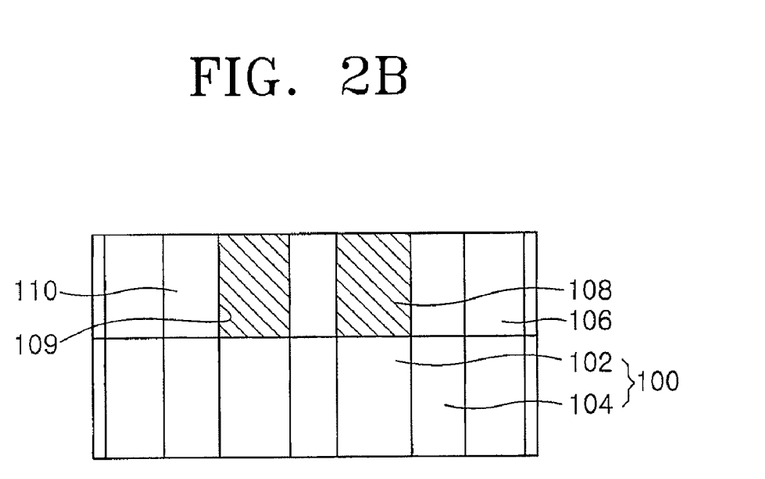
FIGS. 2B, 3B, 4B, 5B and 6B are sectional views of FIGS. 2A, 3A, 4A, 5A and 6A, respectively, taken along line A-A of FIG. 2A.

Referring to FIGS. 2A and 2B, a semiconductor substrate 100 includes an active region 102 defined by a device isolation layer 104. In order to reduce the size of the semiconductor device, the active region 102 is obliquely extended as shown in FIG. 2A. A gate electrode (not shown) is formed on the semiconductor substrate 100 using a known method. Then, a first interlayer insulating layer 110 is formed to cover the gate electrode. For example, the first interlayer insulating layer 110 can be made of a silicon oxide layer.

Contact pads 106 and 108 are formed on the first interlayer insulating layer 110. The contact pads 106 and 108 are formed to have thickness equal to that of the first interlayer insulting layer 110. The contact pads 106 and 108 can be formed by a self-aligned method using insulating spacers (not shown) formed on both sidewalls of the gate electrode.

In another method, a first photoresist pattern (not shown) defining the contact pads 106 and 108 is formed on the first interlayer insulating layer 110. Then, a first contact hole 109 is formed by removing the first interlayer insulating layer 110 along the first photoresist pattern. The first interlayer insulating layer 110 can be removed by using a diluted HF or buffered oxide etchant (BOE) that is a mixture of $NH_4F$, HF, and deionized water. A first contact hole is filled with a conductive material layer, for example, a doped polysilicon layer. The conductive material layer and the first interlayer insulating layer 110 are planarized to have their top surfaces at the same level, thereby forming the contact pads 106 and 108 separated by the first interlayer insulating layer 110, the contact pads 106 and 108 being formed in a shape essentially the same as a section of the first contact hole 109.

Figure 4A:
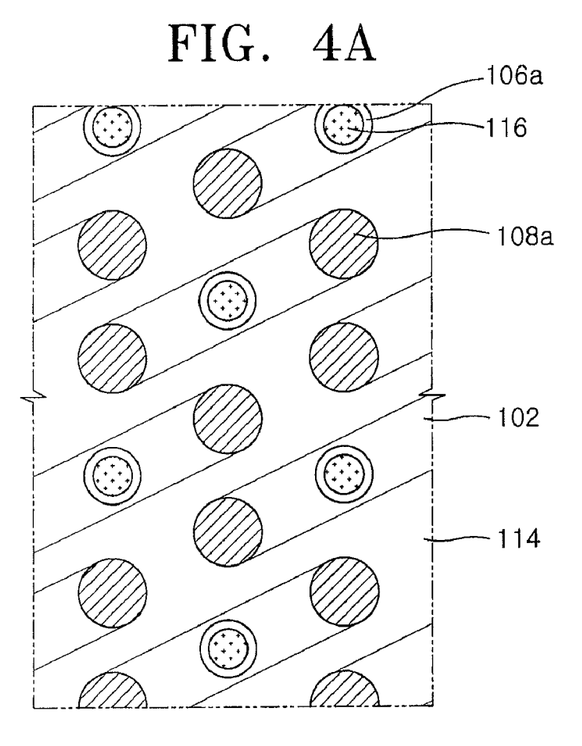

The contact pads 106 and 108 include the bottom electrode contact pad 108 connecting with the bottom electrode contact (124 in FIG. 6A) and the bit line contact pad 106 connecting with the bit line contact 116 in FIG. 4A.

Figure 3A:
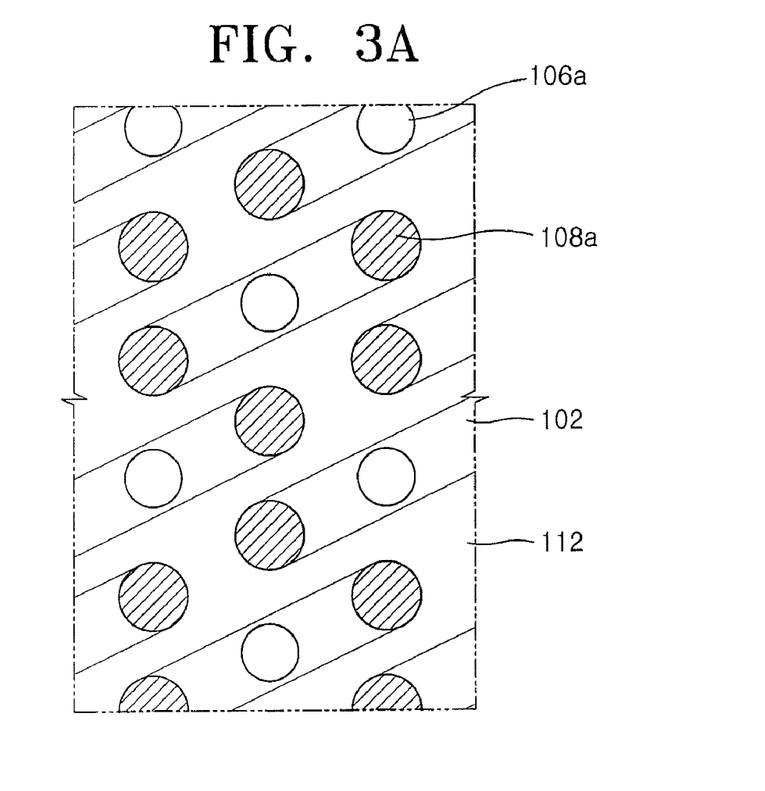
Figure 3B:
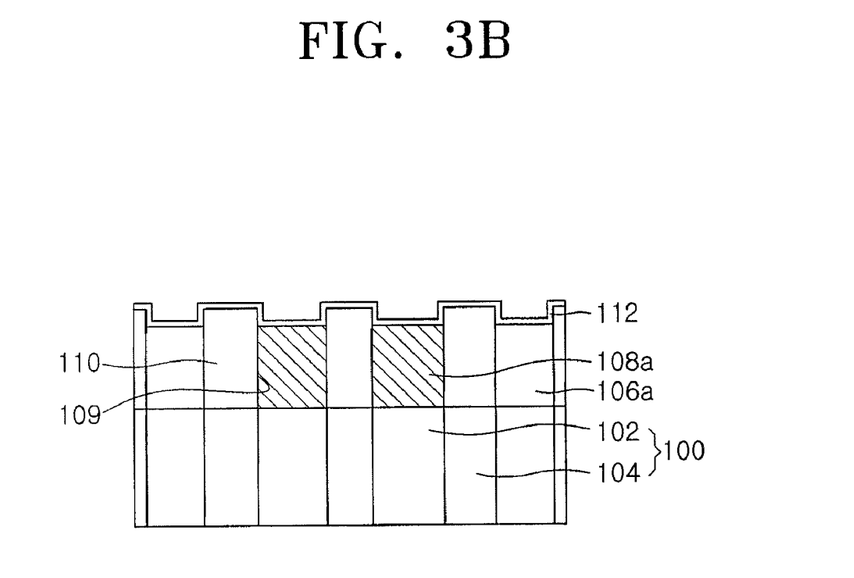

Referring to FIGS. 3A and 3B, recessed contact pads 106A and 108A are formed by removing a predetermined upper portion of the contact pads 106 and 108 such that the contact pads 106 and 108 have smaller thickness than the first interlayer insulating layer 110. The upper portion of the contact pads 106 and 108 can be removed by a partial etching using an etchant that contains $CH_3COOH$. In another method, the contact pad can be removed using a material in which an etching selectivity of polysilicon layer-to-silicon oxide layer is 10-50:1, for example a mixed gas of $CF_4$ and $O_2$. At this time, an etching time is adjusted such that the contact pad is etched to a desired depth. A wafer temperature is maintained in the range of about 0° C.-about 60° C. A power of 100-600 W is applied to an electrode (not shown) of a chamber in which a dry etching is performed. In addition, the chamber is supplied with CF$_4$ gas of 30-80 sccm and O$_2$ gas of 150-300 sccm. It is desirable that the contact pads 106 and 108 are more recessed as the distance between the contacts 116 and 124 becomes shorter.

Then, an etching stopping layer 112 is formed to cover the recessed contact pads 106A and 108A and the first interlayer insulating layer 110 in a blanket method. In order to protect the first interlayer insulating layer 110, the etching stopping layer 112 can be formed of a layer with an etching selectivity different from a silicon oxide layer. For example, the etching stopper layer 112 can be formed of a silicon nitride layer or a silicon oxynitride layer.

Figure 4B:
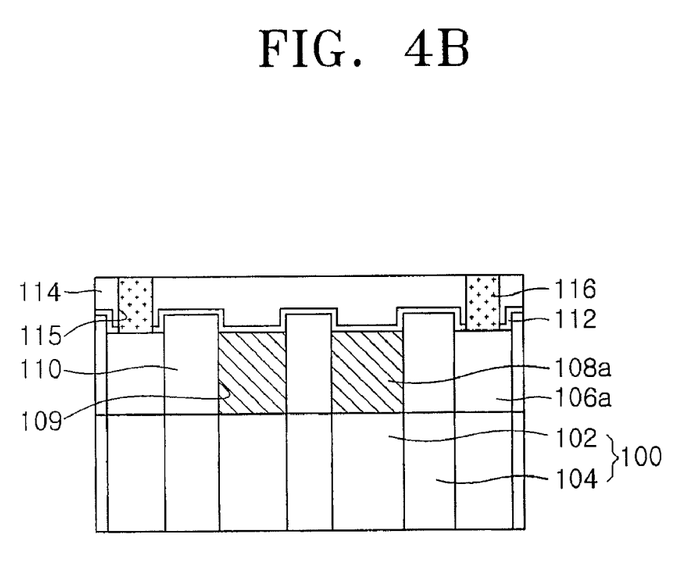

Referring to FIGS. 4A and 4B, the etching stopping layer 112 is covered with a second interlayer insulating layer 114, for example a silicon oxide layer. Then, a second photoresist pattern (not shown) defining the bit line contact 116 is formed on the second interlayer insulating layer 114. By removing the second interlayer insulating layer 114 and the etching stopping layer 112 using the second photoresist pattern as an etching mask, a second contact hole 115 is formed to expose the recessed bit line contact pad 106A. The second interlayer insulating layer 114 has an etching selectivity different from that of the etching stopping layer 112, and the second contact hole 115 is formed using an anisotropic etching. Then, the etching stopping layer 112 is etched to expose the contact pad 106a, and the second contact hole 115 is filled with a conductive material layer. The conductive material layer and the second interlayer insulating layer 114 are planarized to be at essentially the same level, thereby forming the bit line contact 116 separated by the second interlayer insulating layer 114, the bit line contact 116 being formed in a shape essentially the same as a section of the second contact hole 109.

Figure 5A:
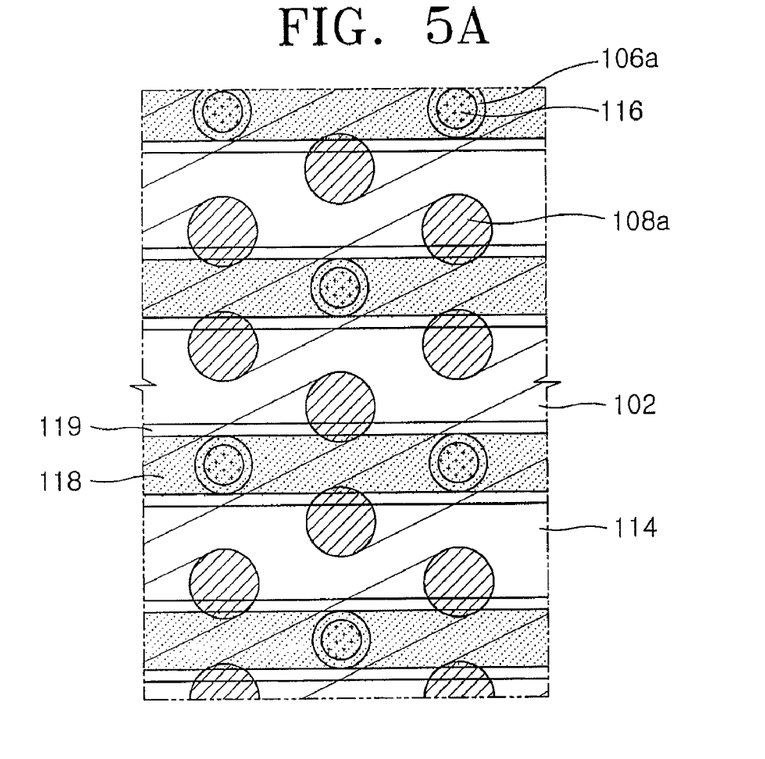
Figure 5B:
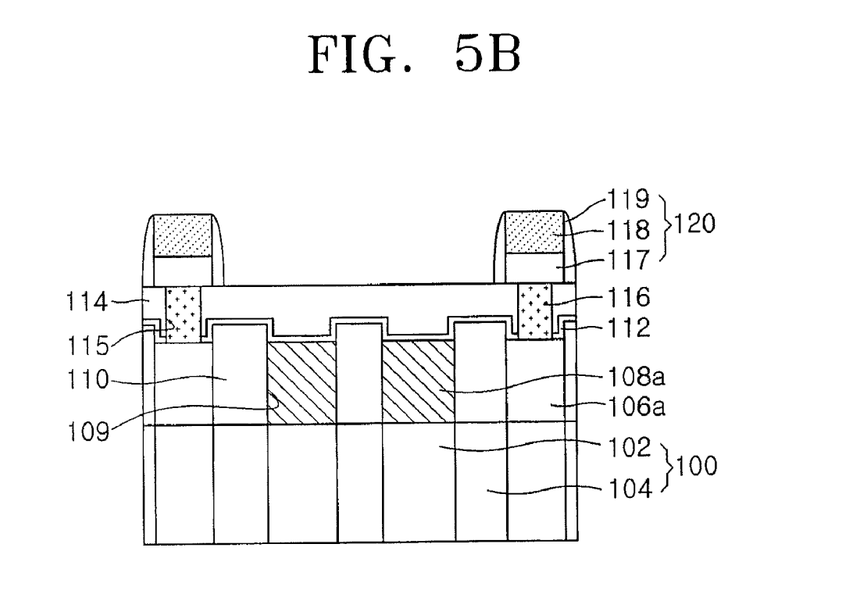

Referring to FIGS. 5A and 5B, a bit line structure 120 including a bit line 117, an insulating layer 118, and a spacer 119 is formed on the bit line contact 116. The bit line structure forms a predetermined angle from the active region 102 extending obliquely. The bit line structures are extended spaced apart by the same distance.

Figure 6A:
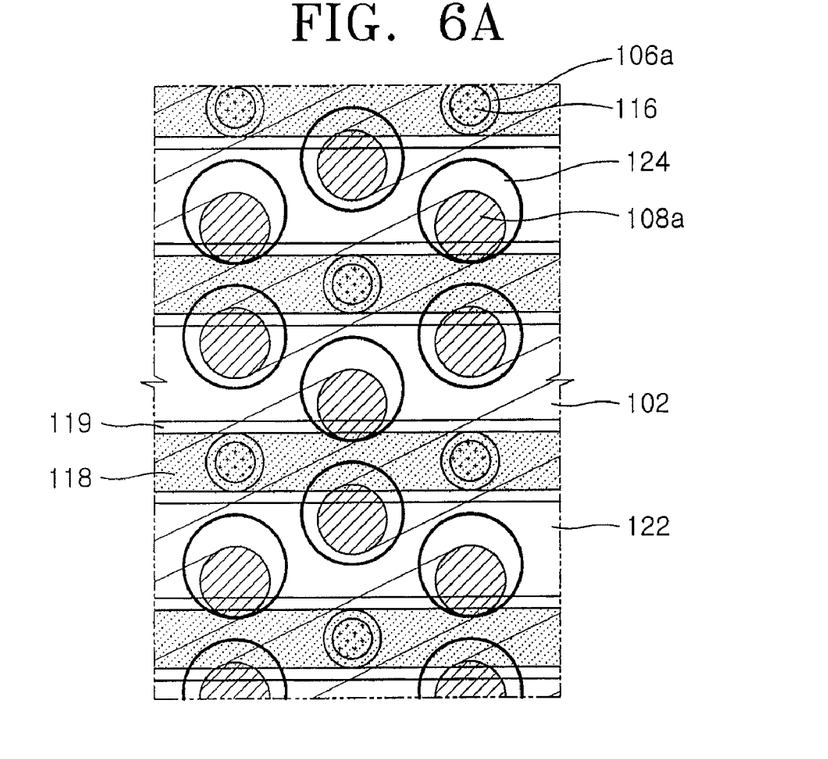
Figure 6B:
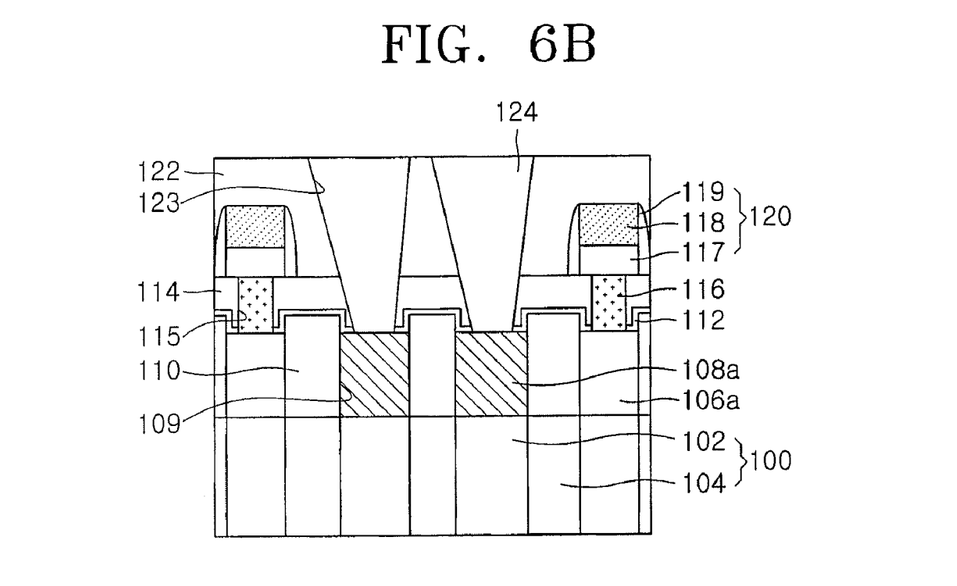

Referring to FIGS. 6A and 6B, a third interlayer insulating layer 122 (or a mold oxide layer) is formed on the second interlayer insulating layer 114 where the bit line structure 120 is formed. In this embodiment, the third interlayer insulating layer 122 is a 2000-Å multi-layer of a TEOS layer and a BPSG layer. That is, the 1800-Å TEOS layer and the 200-Å BPSG layer are sequentially formed using a known method. The TEOS layer can be a plasma enhanced (PE)-TEOS layer.

Then, a third photoresist pattern (not shown) defining a bottom electrode contact 124 is formed on the third interlayer insulating layer 122. By removing the third interlayer insulating layer 122, the second interlayer insulating layer 114 and the etching stopping layer 112 using the third photoresist pattern as an etching mask, a third contact hole 123 is formed to expose the recessed bottom electrode contact pad 108a. The second interlayer insulating layer 114 and the third interlayer insulating layer 122 have etching selectivity different from that of the etching stopping layer 112, and the third contact hole 123 is formed using an anisotropic dry etching. Then, the etching stopping layer 112 is etched to expose the contact pad 106a. The third contact hole 123 is filled with a conductive material layer. The conductive material layer and the third interlayer insulating layer 122 are planarized to be at essentially the same level, thereby forming the bottom electrode contact 124 separated by the third interlayer insulating layer 122, the bottom electrode contact 124 being formed in a shape essentially the same as a section of the third contact hole 123.

A distance between the bottom surfaces of the bottom electrode contacts 124 can be larger than a width of the protruded portion of the first interlayer insulating layer 110. Accordingly, the margin of the bottom electrode contact 124 and its adjacent bit line contact pad 106A increases due to the first interlayer insulating layer 110 protruded.

The electrical short between the contacts and their adjacent contact pads can be prevented by forming the contacts on the recessed contact pads.

In addition, even though the distance between the contact pads becomes narrower, the margin of forming the contacts can be sufficiently obtained because the recess of the contact pads can be adjusted according to the distance between the contacts.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device preventing an electrical short, the method comprising:
    forming a first interlayer insulating layer on a semiconductor substrate having an active region defined by a device isolation layer;
    forming contact pads inside the first interlayer insulating layer, the contact pad electrically connecting the active region with an upper conductive layer and having a thickness equal to that of the first interlayer insulating layer;
    forming recessed contact pads to have less thickness than the first interlayer insulating layer by removing a portion of the contact pads; and
    forming contacts on the contact pads, the contacts being connected with an upper conductive layer,
    wherein the contact pads include:
    a bottom electrode contact pad connecting with a capacitor's bottom electrode contact disposed above the bottom electrode contact pad; and
    a bit line contact pad connecting with a bit line contact disposed above the bit line contact pad, and
    wherein a distance between the bottom surfaces of the capacitor's bottom electrode contact and the bit line contact is larger than a width of a protruded portion of the first interlayer insulating layer.

2. The method of claim 1, wherein in forming the contact pads having the thickness equal to the first interlayer insulating layer, the contact pads are formed by a self-aligned method using insulating spacers formed on both sidewalls of a gate electrode, the gate electrode being formed on the semiconductor substrate.

3. The method of claim 1, wherein forming the contact pads having the thickness equal to that of the first interlayer insulating layer includes:
    forming a first photoresist pattern defining the contact pad on the first interlayer insulating layer;
    forming a first contact hole by removing the first interlayer insulating layer according to a shape of the photoresist pattern;
    filling the first contact hole with a conductive material layer; and
    planarizing the conductive material layer and the first interlayer insulating layer to the same level, thereby forming the contact pads separated by the first interlayer insulating layer, the contact pads being formed in a shape the same as a section of the first contact hole.

4. The method of claim 1, wherein the contact pads are made of doped polysilicon.

5. The method of claim 1, wherein in recessing the contact pads, the contact pads are removed using an etchant that contains $CH_3COOH$.

6. The method of claim 1, wherein in the recessing of the contact pads, the contact pads are removed using a mixed gas of $CF_4$ and $O_2$, the mixed gas being a material in which an etching selectivity of polysilicon layer:silicon oxide layer is 10-50:1.

7. The method of claim 1, wherein forming the contacts connected to the conductive layer includes:
   forming an etching stopping layer to cover the recessed contact pads and the first interlayer insulating layer in a blanket manner;
   covering a second interlayer insulating layer on the etching stopping layer;
   forming a second photoresist pattern defining a bit line contact on the second interlayer insulating layer;
   forming a second contact hole to expose the recessed bit line contact pad by removing the second interlayer insulating layer and the etching stopping layer using the second photoresist pattern as an etching mask;
   filling the second contact hole with a conductive material layer; and
   planarizing the conductive material layer and the second interlayer insulating layer, thereby forming a bit line contact separated by the second interlayer insulating layer, the bit line contact being formed in a shape equal to a section of the second contact hole.

8. The method of claim 7, further comprising, after forming the bit line contact:
   forming a third interlayer insulating layer on the second interlayer insulating layer where the bit line contact is formed;
   forming a third photoresist pattern defining a bottom electrode contact on the third interlayer insulating layer;
   forming a third contact hole to expose the recessed bottom electrode contact pad by removing the third interlayer insulating layer, the second interlayer insulating layer, and the etching stopping layer using the third photoresist pattern as an etching mask;
   filling the third contact hole with a conductive material layer; and
   planarizing the conductive material layer and the third interlayer insulating layer to the same level, thereby forming a bottom electrode contact separated by the third interlayer insulating layer, the bottom electrode contact being formed in a shape the same as a section of the third contact hole.

* * * * *